(12) United States Patent
Kim et al.

(10) Patent No.: US 9,147,862 B2
(45) Date of Patent: Sep. 29, 2015

(54) METHOD OF MANUFACTURING ORGANIC LIGHT EMITTING DISPLAY DEVICE

(71) Applicant: Samsung Display Co., Ltd., Yongin, Gyeonggi-do (KR)

(72) Inventors: Kyung-Ho Kim, Yongin (KR); Jin-Koo Chung, Yongin (KR); Jun-Ho Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/154,658

(22) Filed: Jan. 14, 2014

(65) Prior Publication Data

US 2015/0079710 A1    Mar. 19, 2015

(30) Foreign Application Priority Data

Sep. 13, 2013   (KR) .................. 10-2013-0110625

(51) Int. Cl.
    *H01L 51/56*   (2006.01)
(52) U.S. Cl.
    CPC ...................................... *H01L 51/56* (2013.01)
(58) Field of Classification Search
    CPC ............................ H01L 51/56; H01L 2221/00
    USPC .................... 438/29, 35, 99; 257/E21.214
    See application file for complete search history.

(56) References Cited

U.S. PATENT DOCUMENTS

| 7,199,520 B2 | 4/2007 | Fujii et al. |
| 2006/0038752 A1 | 2/2006 | Winters |
| 2009/0137074 A1 | 5/2009 | Lee et al. |
| 2012/0097928 A1 | 4/2012 | Kim et al. |
| 2013/0032808 A1 | 2/2013 | Anzai et al. |

FOREIGN PATENT DOCUMENTS

| JP | 2003-345271 | 12/2003 |
| KR | 10-0874458 | 12/2008 |
| KR | 10-1179155 | 8/2012 |
| KR | 10-2012-0061106 | 6/2013 |

*Primary Examiner* — Minchul Yang
(74) *Attorney, Agent, or Firm* — Knobbe Martens Olson & Bear LLP

(57) ABSTRACT

A method of manufacturing an organic light emitting display device includes defining pixels on a substrate, each of the pixels including a first area in which light is emitted in a first direction and a second area in which light is emitted in a second direction opposite the first direction; forming first electrodes respectively disposed in the first area of each of the pixels; forming a sacrificial layer in the first area and the second area of each pixel to cover the first electrodes; forming openings in the sacrificial layer to open a patterning area in the respective second area of each of the pixels; forming a conductive layer on the patterning areas and the sacrificial layer; removing the sacrificial layer; forming an intermediate layer including an organic emitting layer; and forming a third electrode on the intermediate layer.

17 Claims, 10 Drawing Sheets

METHOD OF MANUFACTURING ORGANIC LIGHT EMITTING DISPLAY DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2013-0110625, filed on Sep. 13, 2013, in the Korean Intellectual Property Office, the disclosure of which is incorporated herein in its entirety by reference.

BACKGROUND

1. Field

One or more embodiments of the present invention relate to a method of manufacturing an organic light emitting display device.

2. Description of the Related Technology

An organic light emitting display device is a self-emissive display including an organic compound that is electrically excited to emit light. The organic light emitting display device is typically driven via a low voltage, is thin, has a wide view angle, and a high response speed. Thus, the organic light emitting display device has been regarded as a next-generation display that does not have the defects of a liquid crystal display (LCD) device or the like.

In contrast to an LCD device, an organic light emitting display device emits light on two sides. The organic light emitting display device includes pixels, and may be divided into a top emission unit and a bottom emission unit. A reflective anode pattern is formed in the top emission unit, and a transmissive anode pattern is formed in the bottom emission unit.

SUMMARY OF CERTAIN INVENTIVE ASPECTS

One or more embodiments of the present invention include a method of manufacturing an organic light emitting display device, whereby a bottom electrode pattern of a top emission unit and a bottom electrode pattern of a bottom emission unit are not affected by each other during an operation of forming them.

Additional aspects will be set forth in part in the description which follows and, in part, will be apparent from the description, or may be learned by practice of the presented embodiments.

According to one or more embodiments of the present invention, a method of manufacturing an organic light emitting display device, includes: defining a plurality of pixels on a substrate, each of the pixels including a first area in which light is emitted in a first direction and a second area in which light is emitted in a second direction opposite the first direction; forming a plurality of first electrodes respectively disposed in the first area of each of the plurality of pixels; forming a sacrificial layer in the first area and the second area of each of the plurality of pixels to cover the plurality of first electrodes; forming a plurality of openings in the sacrificial layer to open a patterning area in the respective second area of each of the plurality of pixels; forming a conductive layer on the patterning areas and the sacrificial layer; removing the sacrificial layer; forming an intermediate layer including an organic emitting layer; and forming a third electrode on the intermediate layer.

The first electrode may include a transparent conductor.

The conductive layer may be formed by stacking a reflective layer and a transparent conductive layer.

The first electrode may be formed by stacking a reflective layer and a transparent conductive layer.

The conductive layer may include a transparent conductor.

Sidewalls forming the plurality of openings in the sacrificial layer may be inclined at an angle of 90 degrees or greater with respect to a surface of the substrate.

Removing the sacrificial layer may include removing the conductive layer formed on the sacrificial layer.

The sacrificial layer may include a photo-resist.

According to one or more embodiments of the present invention, a method of manufacturing an organic light emitting display device, includes: forming a first electrode in a first area of a substrate; forming a sacrificial layer on the substrate to cover the first electrode; forming an opening in the sacrificial layer to open at least a portion of a second area separated from the first area of the substrate; forming a second electrode in an area corresponding to the opening; forming an intermediate layer including an organic emitting layer on the first electrode and the second electrode; and forming a third electrode on the intermediate layer.

Forming the second electrode may include: forming a conductive layer on the substrate and the sacrificial layer; and removing the sacrificial layer.

The first electrode may include a transparent conductor.

The conductive layer may be formed by stacking a reflective layer and a transparent conductive layer.

The first electrode may be formed by stacking a reflective layer and a transparent conductive layer.

The conductive layer may include a transparent conductor.

Sidewalls forming the opening in the sacrificial layer may be inclined at an angle of 90 degrees or greater with respect to a surface of the substrate.

Removing the sacrificial layer may include removing the conductive layer formed on the sacrificial layer.

The sacrificial layer may include a photo-resist.

These general and specific embodiments may be implemented by using a system, a method, a computer program, or a combination of the system, the method, and the computer program.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Figure 1:
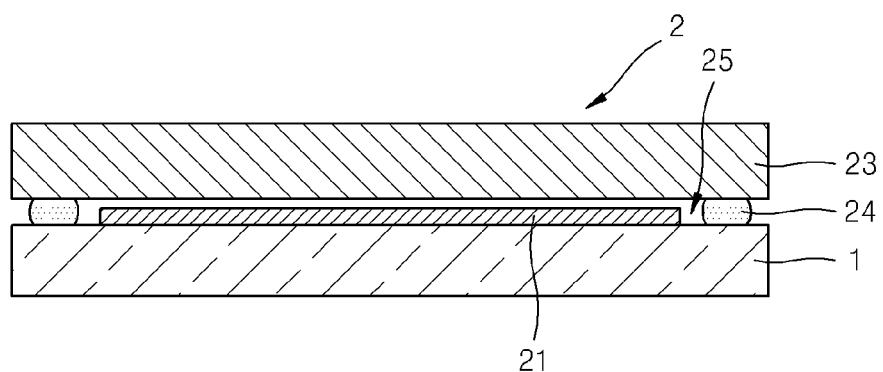
FIG. 1 is a schematic cross-sectional view illustrating an organic light emitting display device according to an embodiment of the present invention.

Reference will now be made in detail to embodiments, examples of which are illustrated in the accompanying drawings, wherein like reference numerals generally refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", and the like, may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the embodiments are not limited thereto.

As used herein, the term "and/or" includes any and all combinations of one or more of the associated listed items. Expressions such as "at least one of," when preceding a list of elements, modify the entire list of elements and do not modify the individual elements of the list.

When forming the reflective anode pattern and the transmissive anode pattern of organic light emitting display devices, the pattern that is formed first may be damaged during an etching operation for forming the other pattern.

FIG. 1 is a schematic cross-sectional view illustrating an organic light emitting display device according to an embodiment of the present invention. Referring to FIG. 1, the organic light emitting display device includes a display unit 2 formed on a substrate 1.

The display unit 2 may include an organic light emitting unit 21 formed on the substrate 1 and an encapsulation substrate 23 encapsulating the organic light emitting unit 21.

The encapsulation substrate 23 prevents penetration of external air or moisture into the organic light emitting unit 21. The encapsulation substrate 23 is formed of a transparent member so that an image formed by the organic light emitting unit 21 may be transmitted through the encapsulation substrate 23.

Edges of the substrate 1 and the encapsulation substrate 23 are coupled to each other by an encapsulation member 24 so that a space 25 between the substrate 1 and the encapsulation substrate 23 is encapsulated. The space 25 may include a moisture absorbent, a filling material, or the like.

Figure 2:
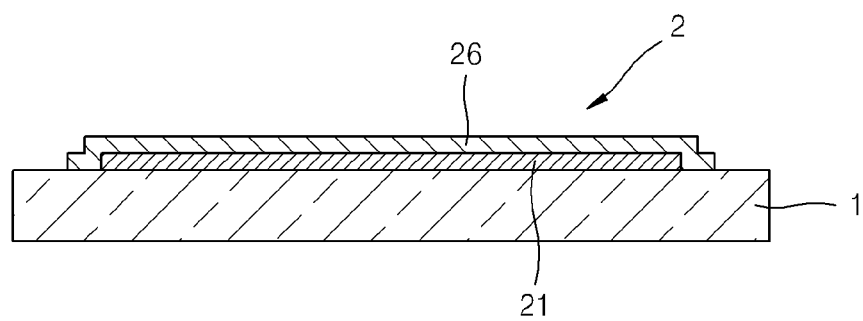
FIG. 2 is a schematic cross-sectional view illustrating an organic light emitting display device according to another embodiment of the present invention.

FIG. 2 is a schematic cross-sectional view illustrating an organic light emitting display device according to another embodiment of the present invention. As illustrated in FIG. 2, instead of the encapsulation substrate 23, a thin film encapsulation layer 26 may be formed on the organic light emitting unit 21 to protect the organic light emitting unit 21 from penetration of external air.

The thin film encapsulation layer 26 may be formed of a plurality of inorganic layers or a combination of an inorganic layer and an organic layer.

The organic layer of the thin film encapsulation layer 26 is formed of polymer. The organic layer may be a single layer or a stacked layer formed of at least one of polyethylene terephthalate, polyimide, polycarbonate, epoxy, polyethylene, or polyacrylate. For example, the organic layer may be formed of polyacrylate, and the organic layer may include a polymerized monomer composition including a diacrylate-based monomer and triacrylate-based monomer. Also, a photo-initiator such as, for example, trimethyl benzoyl diphenyl phosphine oxide (TPO) may be further included in the monomer composition, but the embodiments of the present invention are not limited thereto.

The inorganic layer of the thin film encapsulation layer 26 may be a single layer or a stacked layer including a metal oxide or a metal nitride. The inorganic layer may include at least one of SiNx, $Al_2O_3$, $SiO_2$, or $TiO_2$.

An exposed uppermost layer of the thin film encapsulation layer 26 may be formed of an inorganic layer in order to prevent moisture penetration with respect in the organic light emitting unit 21.

The thin film encapsulation layer 26 may include at least one sandwich structure in which at least one organic layer is inserted between at least two inorganic layers. Alternatively, the thin film encapsulation layer 26 may include at least one sandwich structure in which at least one inorganic layer is inserted between at least two organic layers. Alternatively, the thin film encapsulation layer 26 may include a sandwich structure in which at least one organic layer is inserted between at least two inorganic layers and a sandwich structure in which at least one inorganic layer is inserted between at least two organic layers.

The thin film encapsulation layer 26 may sequentially include a first inorganic layer, a first organic layer, and a second inorganic layer from a top portion of the organic light emitting unit 21.

Alternatively, the thin film encapsulation layer 26 may sequentially include a first inorganic layer, a first organic layer, a second inorganic layer, a second organic layer, and a third inorganic layer from a top portion of the organic light emitting unit 21.

Alternatively, the thin film encapsulation layer 26 may sequentially include a first inorganic layer, a first organic layer, a second inorganic layer, a second organic layer, a third inorganic layer, a third organic layer, and a fourth inorganic layer from a top portion of the organic light emitting unit 21.

A halogenated metal layer including, for example, LiF, may be further included between the organic light emitting unit 21 and the first inorganic layer. The halogenated metal layer may prevent damage of the organic light emitting unit 21 when forming the first inorganic layer by using a sputtering method or a plasma deposition method.

The first organic layer may have a smaller surface area than the second inorganic layer, and the second organic layer may have a smaller surface area than the third inorganic layer.

Alternatively, the first organic layer may be completely covered by the second inorganic layer, and the second organic layer may be completely covered by the third inorganic layer.

Figure 3:
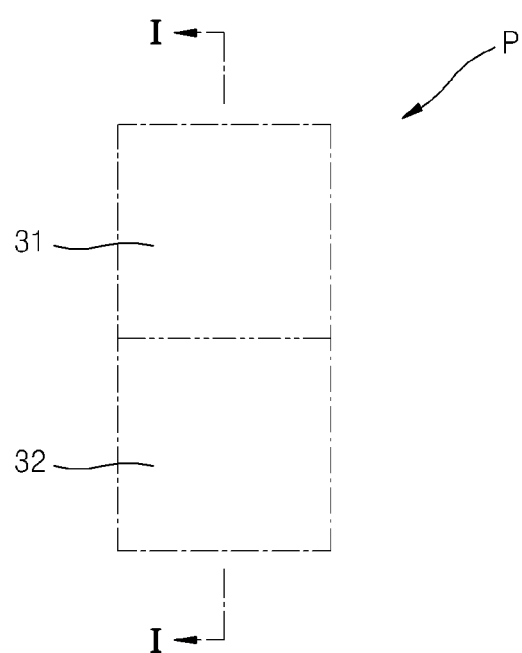
FIG. 3 is a plan view illustrating a pixel of an organic light emitting unit illustrated in FIGS. 1 and 2 according to an embodiment of the present invention.

The organic light emitting unit 21 of FIGS. 1 and 2 may include a plurality of pixels. FIG. 3 is a plan view illustrating a pixel P of the organic light emitting unit 21 illustrated in FIGS. 1 and 2 according to an embodiment of the present invention.

The pixel P may include a first area 31 and a second area 32 that are disposed adjacent to each other. The first area 31 may be a bottom emission area, and the second area 32 may be a top emission area.

The pixel P illustrated in FIG. 3 may be a single sub-pixel in which the first area 31 and the second area 32 emit single-color light. However, the pixel P is not limited thereto, and may also be a single sub-pixel where the first area 31 and the second area 32 emit light of different colors. Hereinafter, a case where the pixel P is a single sub-pixel in which the first area 31 and the second area 32 emit single-color light will be described.

The pixel P may be a sub-pixel that emits red, green, or blue light. In addition to the pixel P illustrated in FIG. 3, the organic light emitting unit 21 of FIGS. 1 and 2 further includes a plurality of sub-pixels that emit light of another color from among red, green, and blue colors.

Alternatively, the pixel P may be a sub-pixel that emits one of red, green, and blue light. In addition to the pixel P illustrated in FIG. 3, the organic light emitting unit 21 of FIGS. 1 and 2 further includes a plurality of sub-pixels that emit light of another color from among red, green, and blue colors.

Alternatively, sub-pixels that emit light of the red, green, and blue colors and/or white light may form a single pixel that emit white light as the lights of the sub-pixels are mixed. In this case, a color converting layer that converts white light of each pixel to a predetermined color or a color filter may be applied.

The red, green, blue, and/or white colors are examples, and the embodiments of the present invention are not limited thereto. In other words, as long as white light is emitted, a combination of various colors besides the combination of the red, green, blue, and/or white light may also be used.

Figure 4:
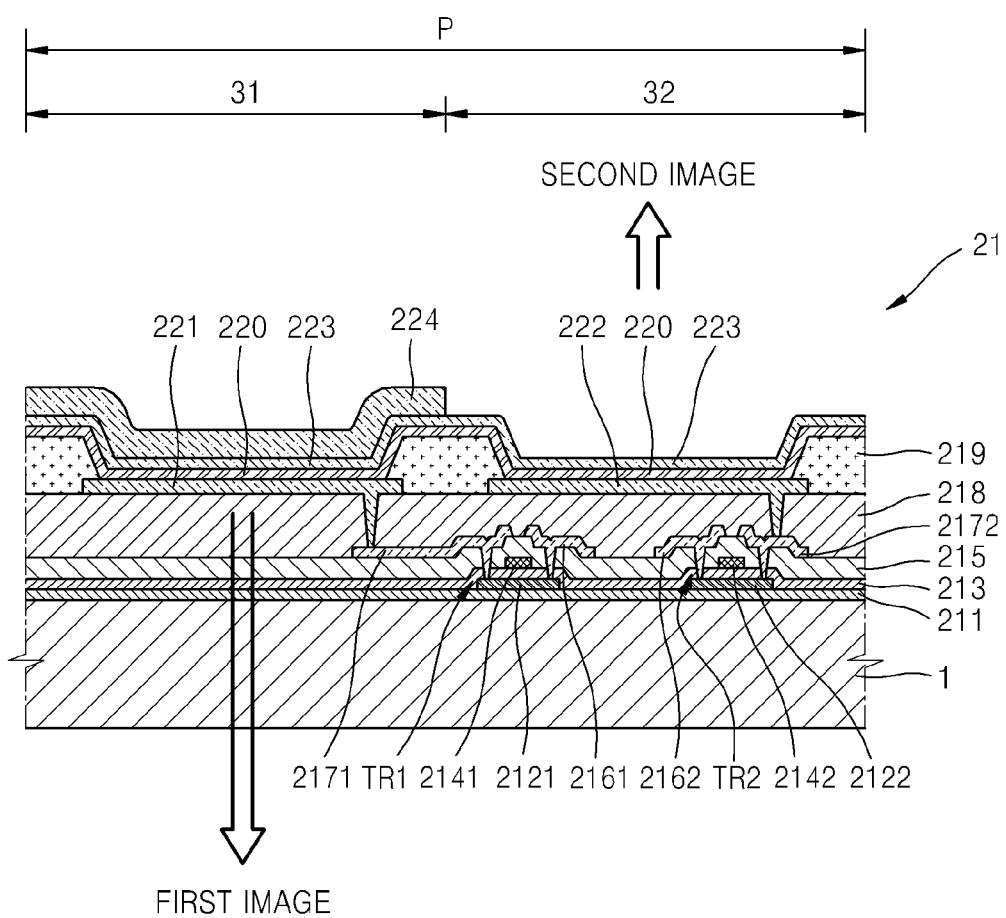
FIG. 4 is a cross-sectional view illustrating the pixel cut along a line I-I of FIG. 3 according to an embodiment of the present invention.

FIG. 4 is a cross-sectional view illustrating the pixel P cut along a line I-I of FIG. 3 according to an embodiment of the present invention.

Referring to FIG. 4, the first area 31 emits a first image in a first direction toward the substrate 1, and the second area 32 emits a second image in a second direction which is opposite the first direction. To this end, organic light emitting devices are disposed in the first area 31 and the second area 32. The organic light emitting devices are electrically connected to the first area 31 and the second area 32. A first pixel circuit unit of the first area 31 is not disposed on an emission path but in the second area 32, thereby preventing a decrease in a light emitting efficiency and luminance of the first image. As a second image is emitted from the second area 32 in the opposite direction from the substrate 1, the first pixel circuit unit that is electrically connected to the organic light emitting device of the first area 31 and the second pixel circuit unit that is electrically connected to the organic light emitting device of the second area 32 may be both disposed in the second area 32. The first pixel circuit unit and the second pixel circuit unit may be each an independent pixel circuit unit, and accordingly, the first image and the second image may be not identical images but different images.

However, the embodiments of the present invention are not limited thereto, and thus, a single pixel circuit unit that is electrically connected to each of the organic light emitting device of the first area and the organic light emitting device of the second area 32 may also be included. The pixel circuit unit may be located in the second area 32 to prevent a decrease in a light emitting efficiency and luminance of the first image.

Figure 5:
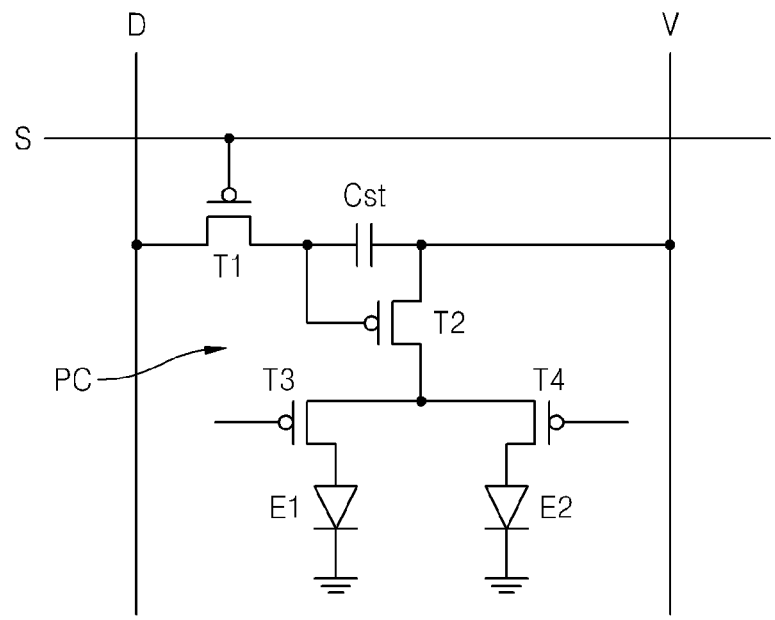
FIG. 5 is a circuit diagram illustrating a pixel circuit unit according to an embodiment of the present invention.

FIG. 5 is a circuit diagram illustrating a pixel circuit unit PC, which is a single pixel circuit unit, according to an embodiment of the present invention. Referring to FIG. 5, a scan line S, a data line D, and a Vdd line V, which is a driving power supply, are electrically connected to the pixel circuit unit PC. Although not shown in FIG. 5, according to a structure of the pixel circuit unit PC, other various conductive lines may be further included in addition to the scan line S, the data line D, and the Vdd line V.

The pixel circuit unit PC includes a switching thin film transistor T1 that is connected to the scan line S and the data line D, a driving thin film transistor T2 that is connected to the switching thin film transistor T1 and the Vdd line V, and a capacitor Cst that is connected to the switching thin film transistor T1 and the driving thin film transistor T2.

A gate electrode of the switching thin film transistor T1 is connected to the scan line S to receive a scan signal, and a first electrode is connected to the data line D, a second electrode is connected to a capacitor Cst and a gate electrode of the driving thin film transistor T2.

A first electrode of the driving thin film transistor T2 is connected to the Vdd line V and the capacitor Cst, and a second electrode of the driving thin film transistor T2 is connected to a first electrode of a first emission control thin film transistor T3 and a first electrode of a second emission control thin film transistor T4.

A second electrode of the first emission control thin film transistor T3 may be electrically connected to a first organic light emitting device E1 located in the first area 31, and a second electrode of the second emission control thin film transistor T4 may be electrically connected to a second organic light emitting device E2 located in the second area 32. Gate electrodes of the first emission control thin film transistor T3 and the second emission control thin film transistor T4 are electrically connected to additional emission signal lines.

The switching thin film transistor T1, the driving thin film transistor T2, and the first and second emission control thin film transistors T3 and T4 of FIG. 5 are all P-type transistors, however, they are not limited thereto, and at least one of the thin film transistors may be an N-type transistor. The number of thin film transistors and capacitors is not limited to those in the illustrated embodiment. Thus, at least two thin film transistors and at least one capacitor may be further included according to the pixel circuit unit PC.

According to the structure of the pixel circuit unit PC as described above, image information input through the data line D may be used to form an image by the first organic light emitting device E1 when the first emission control thin film transistor T3 is open, and also, the image information input may be used to form an image by the second organic light emitting device E2 when the second emission control thin film transistor T4 is open. Thus, the first organic light emitting device E1 and the second organic light emitting device E2 may form different images. Thus, dual emission may be achieved through time division driving so that an image on a top emission surface and an image on a bottom emission surface are not reversed as a mirror image to each other. When the same switching signal is applied to the first emitting control thin film transistor T3 and the second emitting control thin film transistor T4 in a state where the same data signal is applied to the pixel circuit unit PC, a reversed mirror image may be shown on the top and bottom surfaces. As described above, the pixel circuit unit PC may allow various screen configurations while the basic structure of the pixel circuit unit PC is shared by the first organic light emitting device E1 and the second organic light emitting device E2.

Referring to FIG. 4 again, a first thin film transistor TR1 and a second thin film transistor TR2 are located on the substrate 1 and are respectively electrically connected to a first electrode 221 included in the first area 31 and a second electrode 222 included in the second area 32. The first thin film transistor TR1 and the second thin film transistor TR2 may be driving thin film transistors of the first pixel circuit unit and the second pixel circuit unit described above. Alternatively, the first thin film transistor TR1 and the second thin film transistor TR2 may be respectively the first emission thin film transistor T3 and the second emission thin film transistor T4 illustrated in FIG. 5.

As illustrated in FIG. 4, a buffer layer 211 is formed on the substrate 1, and a pixel circuit unit including the first and second thin film transistors TR1 and TR2 is formed on the buffer layer 211.

Semiconductor active layers 2121 and 2122 are formed on the buffer layer 211.

The buffer layer 211 is formed of a transparent insulating material and prevents penetration of impurity elements into the semiconductor active layers 2121 and 2122. Also the buffer layer 211 planarizes a surface of the substrate 1. Thus, the buffer layer 211 may be formed of various materials that are capable of performing these functions. For example, the buffer layer 211 may be formed of an inorganic material such as a silicon oxide, a silicon nitride, a silicon oxynitride, an aluminum oxide, an aluminum nitride, a titanium oxide, or a titanium nitride; an organic material such as polyimide, polyester, or an acryl; or a stack structure including the inorganic and organic materials. The buffer layer 211 may be omitted in some embodiments.

The semiconductor active layers 2121 and 2122 may be formed of polycrystalline silicon, but are not limited thereto, and may also be formed of an oxide semiconductor. For example, the semiconductor active layers 2121 and 2122 may be a G-I—Z—O layer [$(In_2O_3)a(Ga_2O_3)b(ZnO)c$ layer] (where a, b, and c are real numbers that respectively satisfy the conditions of $a \geq 0$, $b \geq 0$, and $c > 0$).

A gate insulating layer 213 is formed on the buffer layer 211 to cover the semiconductor active layers 2121 and 2122, and gate electrodes 2141 and 2142 are formed on the gate insulating layer 213.

An interlayer insulating layer 215 is formed on the gate insulating layer 213 to cover the gate electrodes 2141 and 2142, and source electrodes 2161 and 2162 and drain electrodes 2171 and 2172 are formed on the interlayer insulating layer 215 so that the source electrodes 2161 and 2162 and the drain electrodes 2171 and 2172 respectively contact the semiconductor active layers 2121 and 2122 through contact holes.

Structures of the first and second thin film transistors TR1 and TR2 as described above are not limited thereto, and various structures of thin film transistors are available.

A first insulating layer 218 is formed to cover the first and second thin film transistors TR1 and TR2. The first insulating layer 218 may be a single insulating layer or a plurality of insulating layers whose top surface is planarized. The first insulating layer 218 may be formed of an inorganic material and/or an organic material.

As illustrated in FIG. 4, the first electrode 221 of the first organic light emitting device that is electrically connected to the first thin film transistor TR1 and the second electrode 222 of the second organic light emitting device that is electrically connected to the second thin film transistor TR2 are formed on the first insulating layer 218. The first electrode 221 and the second electrode 222 are formed in the form of an island.

A second insulating layer 219 is formed on the first insulating layer 218 to cover edges of the first electrode 221 and the second electrode 222. The second insulating layer 219 may be formed of an organic material such as acryl or polyimide.

An intermediate layer 220 including an organic emitting layer is formed on the first electrode 221 and the second electrode 222, and a third electrode 223 is formed to cover the intermediate layer 220, thereby forming the organic light emitting devices.

The intermediate layer 220 may be formed of a low-molecular or polymer organic layer.

The intermediate layer 220 may include a first intermediate layer, a second intermediate layer, and an organic emitting layer interposed between the first and second intermediate layers.

The first intermediate layer is interposed between the organic emitting layer and the first and second electrodes 221 and 222, and may include a hole injection layer (HIL) and/or a hole transport layer (HTL).

The second intermediate layer is interposed between the organic emitting layer and a third electrode, and may include an electron transport layer (ETL) and/or an electron injection layer (EIL).

The organic emitting layer may be formed for each of red, green, and blue sub-pixels, and the first and second intermediate layers are common layers for the respective sub-pixels. Referring to FIG. 4, the first area 31 and the second area 32 are included in a pixel P that forms a sub-pixel, and thus, a single-color organic emitting layer may be deposited in the first area 31 and the second area 32. However, the embodiments of the present invention are not limited thereto, and the organic emitting layer may be in different colors in the first area 31 and the second area 32.

The HIL may include a phthalocyanine compound such as copper phthalocyanine or a Starbust type amine such as TCTA, m-MTDATA, or m-MTDAPB.

The HTL may include N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD).

The ETL may include tris(8-hydroxy-quinolinato)aluminum (Alq3).

The EIL may include LiF, NaCl, CsF, $Li_2O$, BaO, or Liq.

The organic emitting layer may include a host material and a dopant material.

The host material may include Alq3, 9,10-di(naphth-2-yl) anthracene (ADN), 2-Tert-butyl-9,10-di(naphth-2-yl)anthracene (TBADN), 4,4'-bis(2,2-diphenyl-ethene-1-yl)biphenyl (DPVBi), or 4,4'-bis(2,2-di(4-methylphenyl)-ethene-1-yl)biphenyl (p-DMDPVBi).

The dopant material may include DPAVBi (4,4'-bis[4-(di-p-tolylamino)styril]biphenyl), ADN (9,10-di(naph-2-tyl)anthracene), or TBADN (2-tert-butyl-9,10-di(naphth-2-yl)anthracene).

The first electrode 221 and the second electrode 222 may function as an anode electrode, and the third electrode 223 may function as a cathode electrode, and polarities of the first electrode 221 and the second electrode 222, and the third electrode 223 may also be exchanged.

When the first electrode 221 and the second electrode 222 function as an anode electrode, the first electrode 221 and the second electrode 222 may include ITO, IZO, ZnO, or $In_2O_3$ which have a high work function. The second electrode 222 included in the second area 32 in which an image is formed in a direction away from the substrate 1 may further include a reflective layer (not shown) that includes at least one of Ag, Mg, Al, Pt, Pd, Au, Ni, Nd, Ir, Cr, Li, Yb, Co, Sm, or Ca.

When the third electrode 223 functions as a cathode electrode, the third electrode 223 may be formed of a metal such as Ag, Mg, Al, Pt, Pd, Au, Ni, Nd, Ir, Cr, Li, Yb, Co, Sm or Ca. In order that a second image may be easily formed, light from an emitting layer may have to be transmitted through the third electrode 223. To this end, the third electrode 223 may be formed of a thin film formed of Mg and/or Mg alloy. The third electrode 223 may also be formed of a thin film formed of Ag and/or Ag alloy which has a relatively high light transmittivity. The third electrode 223 may be formed by co-depositing or stacking Mg and/or Mg alloy and Ag and/or Ag alloy.

Unlike the first electrode 221 and the second electrode 222, the third electrode 223 is formed as a common electrode. Thus, a common voltage is applied to all pixels. Also, the third electrode 223 may be formed by commonly depositing the metal instead of patterning the third electrode 223 for each pixel by using an open mask. Accordingly, the third electrode 223 may be located both in the first area 31 and the second area 32.

A fourth electrode 224 may be disposed on the third electrode 223 of the first area 31. The fourth electrode 224 may be electrically connected to the third electrode 223, thereby preventing a voltage drop of the third electrode 223. To this end, the fourth electrode 224 may be thicker than the third electrode 223.

The fourth electrode 224 may be formed of the same material as the third electrode 223, but is not limited thereto. The fourth electrode 224 may be formed of another material different from the third electrode 223. The fourth electrode 224 may include Mg and/or Mg alloy.

The fourth electrode 224 may be patterned to be located in the first area 31 and not in the second area 32. Accordingly, when the organic light emitting device of the first area 31 emits a first image toward the substrate 1, the fourth electrode 224 may function as a reflection plate, thereby further increasing an image quality of the first image.

FIGS. 6A through 6D are cross-sectional views illustrating a method of sequentially forming the first electrode 221 and the second electrode 222 of FIG. 4, according to an embodiment of the present invention.

Figure 6A:
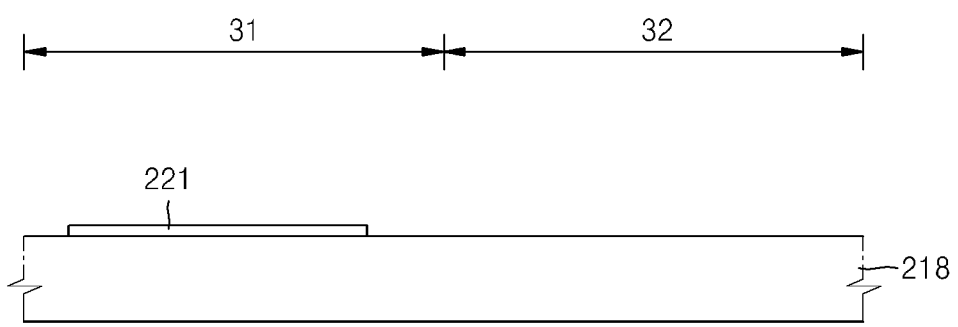
FIGS. 6A through 6D are cross-sectional views illustrating a method of sequentially forming a first electrode and a second electrode of FIG. 4, according to an embodiment of the present invention.

First, as illustrated in FIG. 6A, the first electrode 221 is formed on the first insulating layer 218. The first electrode 221 may be formed of a transparent conductor, and may include ITO, IZO, ZnO, or $In_2O_3$. As illustrated in FIG. 6A, the first electrode 221 is located in the first area 31 of each pixel, and may be formed as a single layer. However, the structure of the first electrode 221 is not limited thereto, and the first electrode 221 may further include a semi-transmissive reflective layer so that a resonance structure may be applied.

Figure 6B:
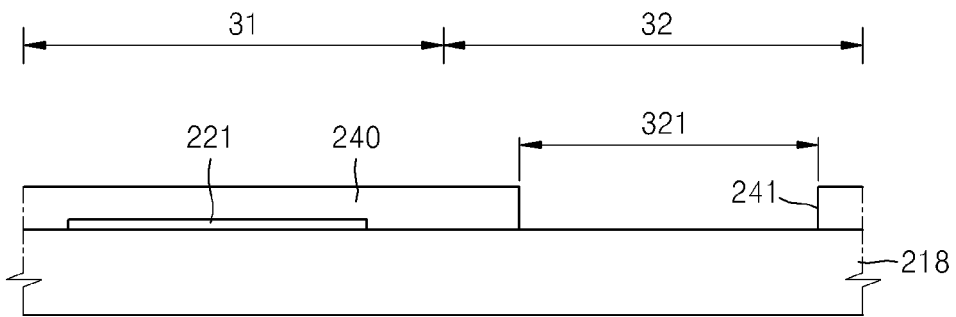

Next, as illustrated in FIG. 6B, a sacrificial layer 240 is formed on the first insulating layer 218. The sacrificial layer 240 is formed to cover the first electrode 221. The sacrificial layer 240 includes an opening 241 formed to open a sub-second area 321 which is a portion of the second area 32. Accordingly, the first insulating layer 218 of the sub-second area 321 is exposed through the opening 241.

Figure 7A:
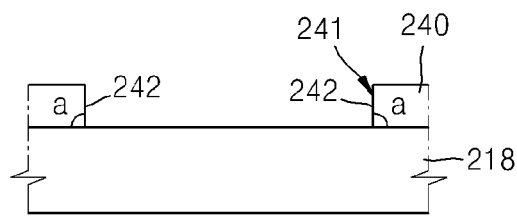
FIG. 7A is a cross-sectional view illustrating a sacrificial layer and an opening according to an embodiment of the present invention.
Figure 7B:
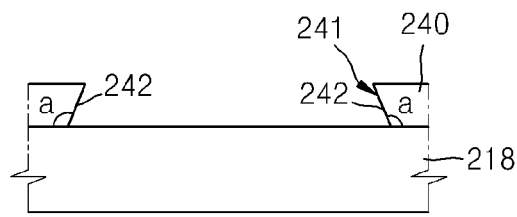
FIG. 7B is a cross-sectional view illustrating a sacrificial layer and an opening according to another embodiment of the present invention.

FIG. 7A is a cross-sectional view illustrating the sacrificial layer 240 and the opening 241 according to an embodiment of the present invention. FIG. 7B is a cross-sectional view illustrating a sacrificial layer and an opening according to another embodiment of the present invention. As illustrated in FIG. 7A, sidewalls 242 of the sacrificial layer 240 which form the opening 241 may be inclined at a predetermined angle, a, with respect to a surface of the first insulating layer 218, for example, at an angle of 90 degrees.

However, the present invention is not limited thereto, and as illustrated in FIG. 7B, the sidewalls 242 of the sacrificial layer 240 which form the opening 241 may also be inclined at an obtuse angle, a, greater than 90 degrees with respect to the surface of the first insulating layer 218.

The angle, a, formed by the sidewall 242 of the sacrificial layer 240 with respect to the surface of the first insulating layer 218 may be an angle between the sidewall 242 of the sacrificial layer 240 and a surface of the substrate 1.

Figure 6C:
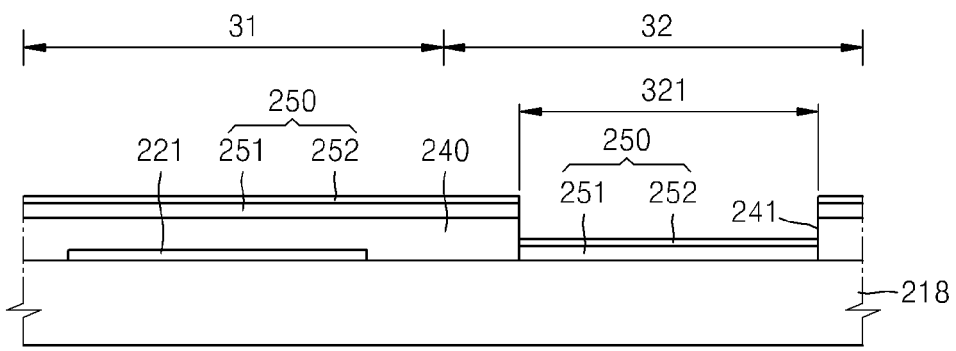

Next, as illustrated in FIG. 6C, a conductive layer 250 is formed on the sacrificial layer 240 and the first insulating layer 218. The conductive layer 250 is formed over the entire area of the first area 31 and the second area 32 by using an open mask. Thus, the conductive layer 250 may be formed on the first insulating layer 218 in the sub-second area 321.

When the sidewall 242 of the sacrificial layer 240 is at an angle a of 90 degrees or greater with respect to a surface of the first insulating layer 218, the conductive layer 250 formed on the sacrificial layer 240 and the conductive layer 250 formed on the first insulating layer 218 in the sub-second area 321 may be disconnected.

The conductive layer 250 may be formed of a material for forming the second electrode 222. For example, the conductive layer 250 may include a first conductive layer 251 and a second conductive layer 252 stacked on the first conductive layer 251. The first conductive layer 251 may be a reflective layer formed of a metal such as Ag, Mg, Al, Pt, Pd, Au, Ni, Nd, Ir, Cr, Li, Yb, Co, Sm or Ca. The second conductive layer 252 may be a transparent conductive layer formed of a transparent conductor such as ITO, IZO, ZnO, or $In_2O_3$.

Figure 6D:
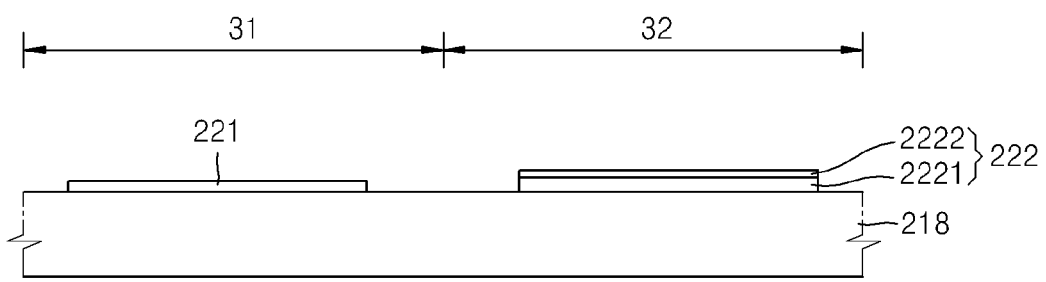

Next, the sacrificial layer 240 is removed to form the first electrode 221 and the second electrode 222 as illustrated in FIG. 6D. The second electrode 222 includes a sub-first electrode 2221 and a sub-second electrode 2222 stacked on the sub-first electrode 2221. The above-described first conductive layer 251 is the sub-first electrode 2221, and the second conductive layer 252 is the sub-second electrode 2222.

When removing the sacrificial layer 240, the conductive layer 250 formed on the sacrificial layer 240 may also be removed at the same time.

The sacrificial layer 240 may be formed of a photo resist so that a patterning operation and a removing operation may be easily performed, but the embodiments of the present invention are not limited thereto, and any material which may be easy to form a pattern or remove may be used.

As described above, as the first electrode 221 that is covered by the sacrificial layer 240 is exposed at the same time when the sacrificial layer 240 is removed, an operation of forming the second electrode 222 does not damage the first electrode 221 which is already formed. The sacrificial layer 240 may be easily removed, like a photoresist, and thus, may be simply and cleanly removed by using a dry etching method. Thus, the second electrode 222 does not have to be patterned by using a typical wet patterning method, and the manufacturing process may be further simplified.

In the above-described embodiment of the present invention, the first electrode 221 is formed before the second electrode 222. However, the second electrode 222 may be formed before the first electrode 221.

FIGS. 8A through 8D are cross-sectional views illustrating a method of sequentially forming the first electrode 221 and the second electrode 222 of FIG. 4, according to another embodiment of the present invention.

Figure 8A:
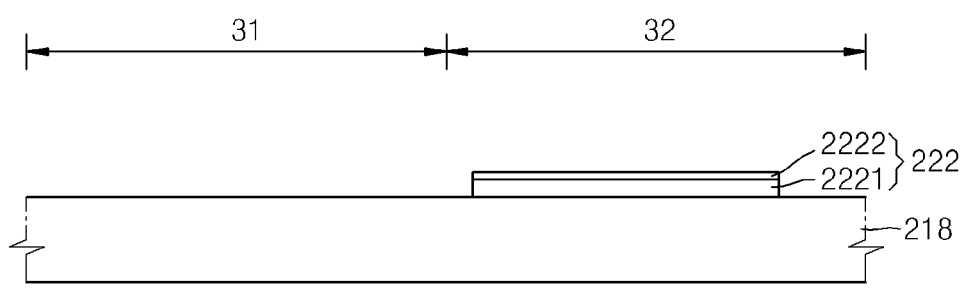
FIGS. 8A through 8D are cross-sectional views illustrating a method of sequentially forming a first electrode and a second electrode of FIG. 4, according to another embodiment of the present invention.

As illustrated in FIG. 8A, first, the second electrode 222 is formed in the second area 32 of the first insulating layer 218. The second electrode 222 may include a sub-first electrode 2221 and a sub-second electrode 2222 stacked on the sub-first electrode 2221. The sub-first electrode 2221 may be a reflective layer formed of a metal such as Ag, Mg, Al, Pt, Pd, Au, Ni, Nd, Ir, Cr, Li, Yb, Co, Sm or Ca. The sub-second electrode 22222 may be a transparent conductive layer formed of a transparent conductor such as ITO, IZO, ZnO, or $In_2O_3$.

Figure 8B:
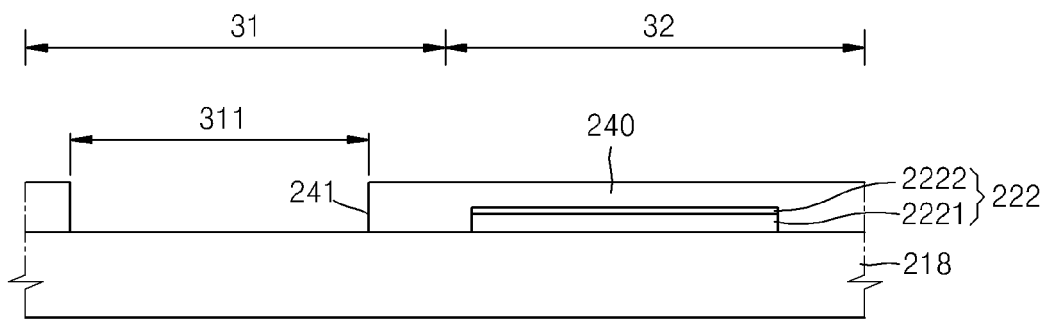

As illustrated in FIG. 8B, a sacrificial layer 240 is formed on the first insulating layer 218. The sacrificial layer 240 is formed to cover the second electrode 222. The sacrificial layer 240 includes an opening 241 formed to open a sub-first area 311 which is a portion of the first area 31. Accordingly, the first insulating layer 218 of the sub-first area 311 is exposed through the opening 241.

As illustrated in FIG. 7A or 7B, the sidewalls 242 of the sacrificial layer 240 which form the opening 241 may be inclined at a predetermined angle of 90 degrees or greater with respect to a surface of the first insulating layer 218.

Figure 8C:
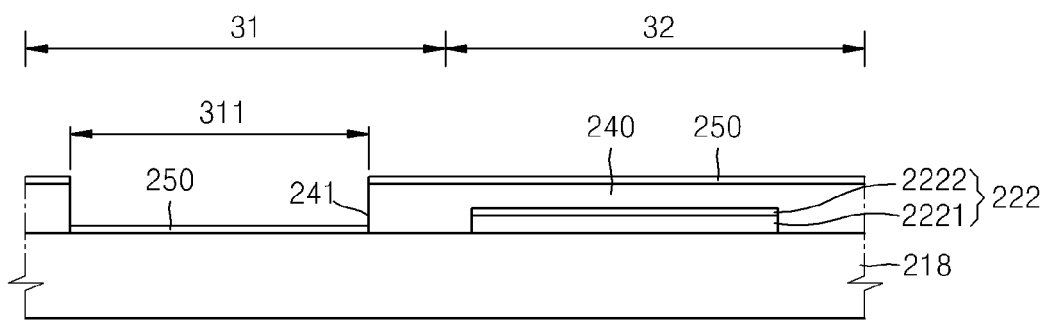

As illustrated in FIG. 8C, a conductive layer 250 is formed on the sacrificial layer 240 and the first insulating layer 218. The conductive layer 250 is formed over the entire area of the first area 31 and the second area 32 by using an open mask. Thus, the conductive layer 250 may be formed on the first insulating layer 218 in the sub-first area 311 which is a patterning area.

The conductive layer 250 formed on the sacrificial layer 240, and the conductive layer 250 formed on the first insulating layer 218 in the sub-first area 311 may be disconnected.

The conductive layer 250 may be formed of a material for forming the first electrode 221. For example, the conductive layer 250 may include a transparent conductive layer formed of ITO, IZO, ZnO, or $In_2O_3$.

Figure 8D:
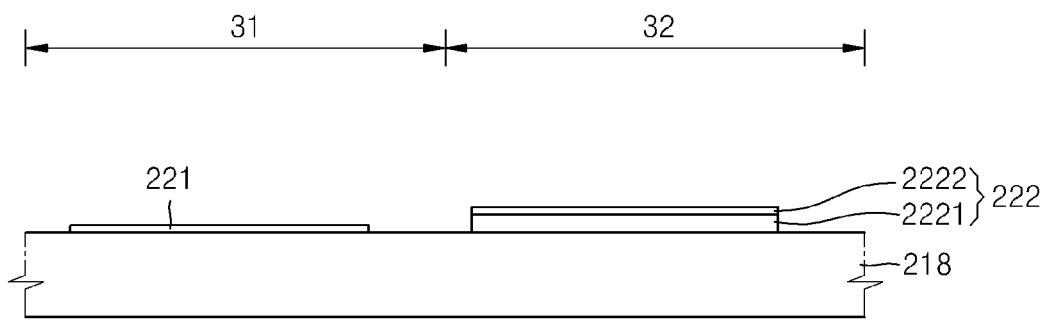

Next, as illustrated in FIG. 8D the first electrode 221 and the second electrode 222 are formed by removing the sacrificial layer 240. The above-described conductive layer 250 becomes the first electrode 221.

When removing the sacrificial layer 240, the conductive layer 250 formed on the sacrificial layer 240 may also be removed.

As described above, as the second electrode 222 that is covered by the sacrificial layer 240 is exposed at the same time when the sacrificial layer 240 is removed, an operation of forming the first electrode 221 does not damage the second electrode 222 which is formed before the first electrode 221.

Figure 9:
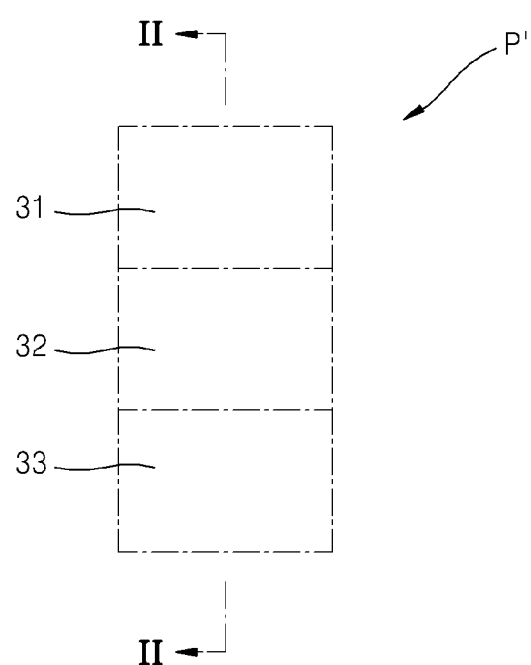
FIG. 9 is a plan view illustrating a pixel of the organic light emitting unit of FIGS. 1 and 2 according to an embodiment of the present invention.

FIG. 9 is a plan view illustrating a pixel P' of the organic light emitting unit 21 of FIGS. 1 and 2 according to another embodiment of the present invention.

The pixel P' includes a first area 31, a second area 32, and a third area 33 that are adjacent to one another. The first area 31 may be a bottom emission area, the second area 32 may be a top emission area, and the third area 33 may be an external light transmission area through which external light is transmitted in a thickness direction of an organic light emitting device. The first area 31, the second area 32, and the third area 33 are sequentially arranged in a vertical direction in FIG. 9, however, the embodiments of the present invention are not limited thereto. For example, the third area 33, the first area 31, and the second area 32 may be sequentially arranged, or the first area 31, the third area 33, and the second area 32 may be sequentially arranged.

In addition, as illustrated in FIG. 9, the third area 33 may be included in each sub-pixel, but the embodiments of the present invention are not limited thereto. For example, the third area 33 may be included in each of repeated groups of sub-pixels. Alternatively, the third area 33 may be included in sub-pixels that form a single pixel, for example, in each of red, green, and blue sub-pixels or in each of red, green, blue, and white sub-pixels.

Figure 10:
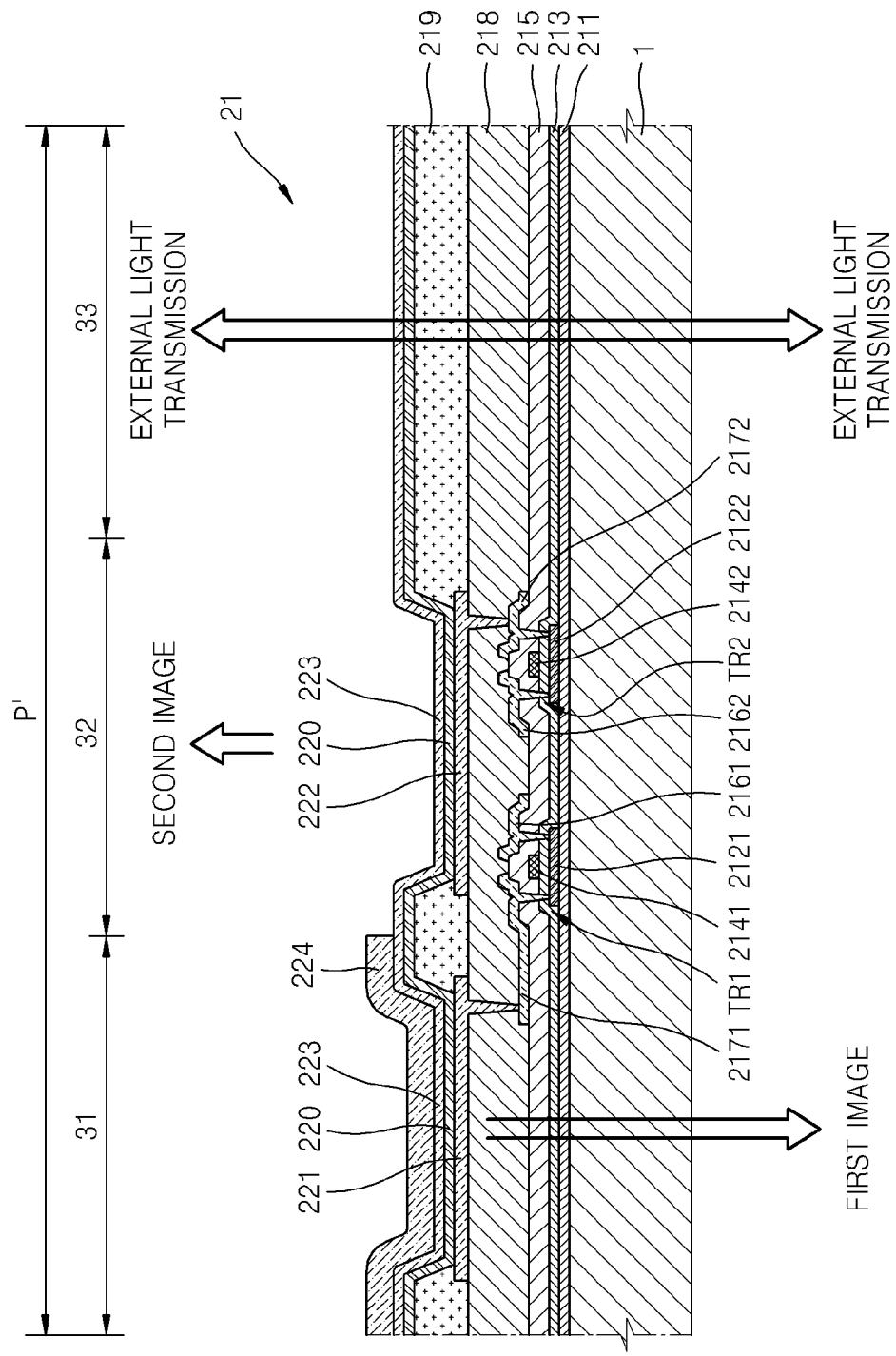
FIG. 10 is a cross-sectional view illustrating the pixel cut along a line II-II of FIG. 9 according to an embodiment of the present invention.

FIG. 10 is a cross-sectional view illustrating the pixel P' cut along a line II-II of FIG. 9 according to an embodiment of the present invention.

In the embodiment of FIG. 10, the pixel P' may be patterned such that the third electrode 223 is formed in all of the first area 31, the second area 32, and the third area 33, and the fourth electrode 224 may be formed only in the first area 31 but not in the second area 32 and the third area 33.

Accordingly, a decrease due to the fourth electrode 224 in a transmittivity of the third area 33 through which external light is transmitted may be prevented, and a transparent, double-sided emission display device including an organic light emitting unit with an increased external light transmittivity may be provided.

Figure 11:
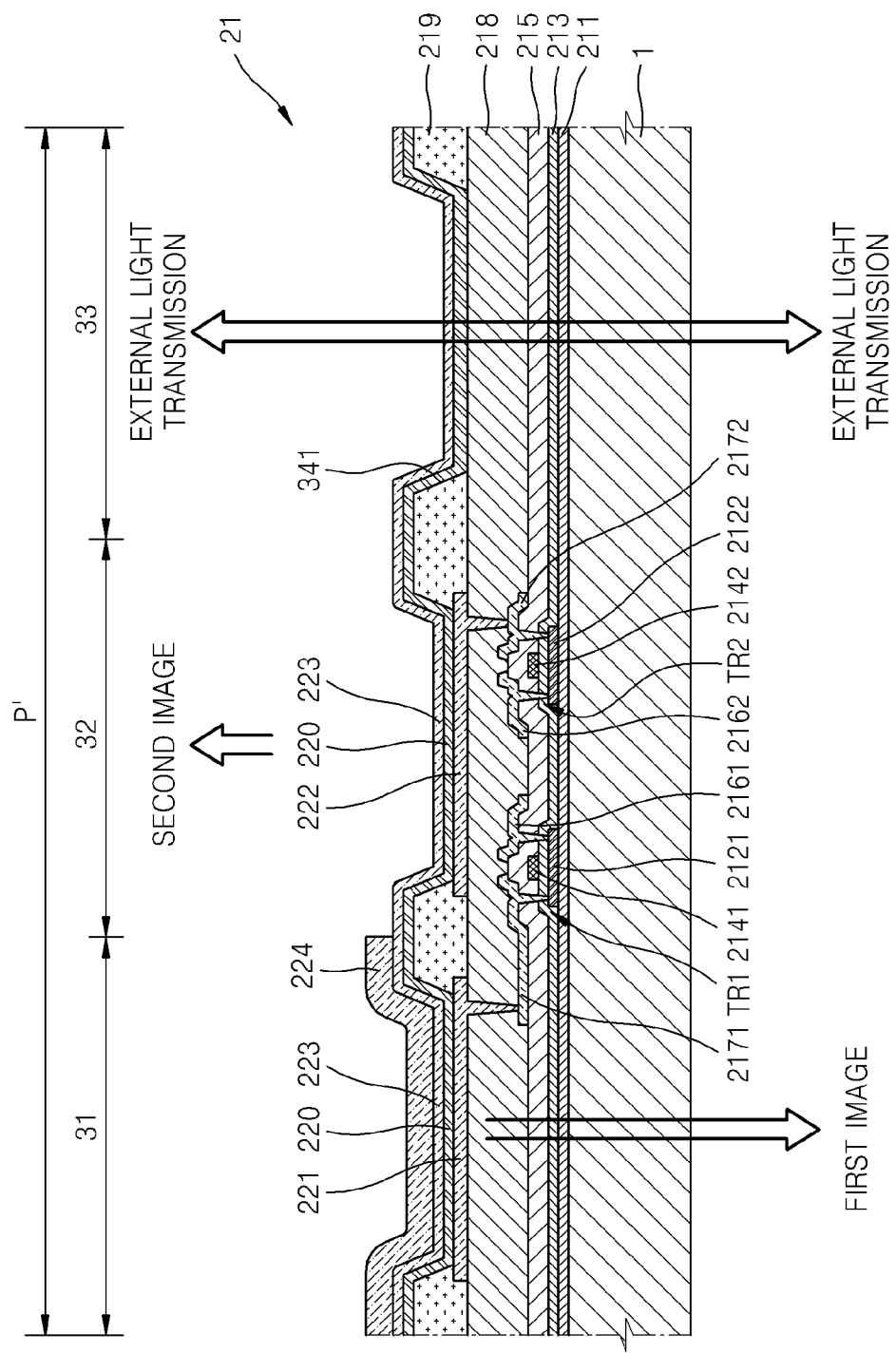
FIG. 11 is a cross-sectional view illustrating the pixel that is cut along a line II-II of FIG. 9 according to another embodiment of the present invention.

FIG. 11 is a cross-sectional view illustrating the pixel P' that is cut along a line II-II of FIG. 9 according to another embodiment of the present invention.

Differently from FIG. 10, in FIG. 11, the second insulating layer 219 further includes a transmission window 341 in the third area 33. The transmission window 341 is formed by removing a portion of the second insulating layer 219. As the transmission window 341 is formed in the third area 33, external light transmittivity in the third area 33 may be increased. Although the transmission window 341 is formed only in the second insulating layer 219 in FIG. 11, the embodiments of the present invention are not limited thereto, and a transmission window connected to the transmission window 341 may be further formed in at least one of the first insulating layer 218, the interlayer insulating layer 215, the gate insulating layer 213, and the buffer layer 211. Also, a transmission window that is connected to the transmission window 341 may be further formed in the third electrode 223.

The first electrode 221 and the second electrode 222 in FIGS. 10 and 11 may also be formed in the same manner as in the embodiment illustrated in FIGS. 6A through 6D or in FIGS. 8A through 8D.

As described above, according to one or more embodiments of the present invention, a first electrode and a second electrode, which are bottom electrodes, may be formed without being affected by each other, and thus, a manufacturing operation may be simplified.

It should be understood that the embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the appended figures, it will be understood by those of ordinary skill in the art that various changes in form and details may be made therein without departing from the spirit and scope of the present invention as defined by the following claims.

What is claimed is:

1. A method of manufacturing an organic light emitting display device, the method comprising:
    defining a plurality of pixels on a substrate, each of the pixels including a first area in which light is emitted in a first direction and a second area in which light is emitted in a second direction opposite the first direction;
    forming a plurality of first electrodes respectively disposed in only the first area of each of the plurality of pixels;
    forming a sacrificial layer in the first area and the second area of each of the plurality of pixels to cover the plurality of first electrodes, the sacrificial layer having a plurality of openings to open a patterning area in the respective second area of each of the plurality of pixels;
    forming a conductive layer on the patterning areas and the sacrificial layer;
    removing the sacrificial layer entirely from the first and second areas;
    forming an intermediate layer including an organic emitting layer; and
    forming a third electrode on the intermediate layer.

2. The method of claim 1, wherein the first electrode comprises a transparent conductor.

3. The method of claim 2, wherein the conductive layer is formed by stacking a reflective layer and a transparent conductive layer.

4. The method of claim 1, wherein the first electrode is formed by stacking a reflective layer and a transparent conductive layer.

5. The method of claim 4, wherein the conductive layer comprises a transparent conductor.

6. The method of claim 1, wherein sidewalls forming the plurality of openings in the sacrificial layer are inclined at an angle of 90 degrees or greater with respect to a surface of the substrate.

7. The method of claim 1, wherein removing the sacrificial layer comprises removing the conductive layer formed on the sacrificial layer.

8. The method of claim 1, wherein the sacrificial layer includes a photo-resist.

9. A method of manufacturing an organic light emitting display device, the method comprising:
    forming a first electrode in only a first area of a substrate;
    forming a sacrificial layer on the substrate to cover the first electrode, the sacrificial layer having an opening to open at least a portion of a second area separated from the first area of the substrate;
    forming a second electrode in an area corresponding to the opening;
    removing the sacrificial layer entirely from the first and second areas;
    forming an intermediate layer including an organic emitting layer on the first electrode and the second electrode; and
    forming a third electrode on the intermediate layer.

10. The method of claim 9, wherein forming the second electrode comprises:
    forming a conductive layer on the substrate and the sacrificial layer.

11. The method of claim 10, wherein the first electrode comprises a transparent conductor.

12. The method of claim 11, wherein the conductive layer is formed by stacking a reflective layer and a transparent conductive layer.

13. The method of claim 10, wherein the first electrode is formed by stacking a reflective layer and a transparent conductive layer.

14. The method of claim 13, wherein the conductive layer comprises a transparent conductor.

15. The method of claim 10, wherein removing the sacrificial layer comprises removing the conductive layer formed on the sacrificial layer.

16. The method of claim 9, wherein sidewalls forming the opening in the sacrificial layer are inclined at an angle of 90 degrees or greater with respect to a surface of the substrate.

17. The method of claim 9, wherein the sacrificial layer includes a photo-resist.

* * * * *